United States Patent
Ye et al.

(10) Patent No.: US 9,613,808 B1
(45) Date of Patent: Apr. 4, 2017

(54) METHOD OF FORMING MULTILAYER HARD MASK WITH TREATMENT FOR REMOVING IMPURITIES AND FORMING DANGLING BONDS

(71) Applicant: UNITED MICROELECTRONICS CORP., Hsin-Chu (TW)

(72) Inventors: Yi-Liang Ye, Kaohsiung (TW); Kuang-Hsiu Chen, Tainan (TW); Chueh-Yang Liu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/001,094

(22) Filed: Jan. 19, 2016

(51) Int. Cl.
  *H01L 21/033* (2006.01)
  *H01L 21/02* (2006.01)

(52) U.S. Cl.
  CPC ...... *H01L 21/0337* (2013.01); *H01L 21/0217* (2013.01); *H01L 21/0228* (2013.01); *H01L 21/02164* (2013.01); *H01L 21/02307* (2013.01); *H01L 21/02343* (2013.01); *H01L 21/02359* (2013.01); *H01L 21/0332* (2013.01)

(58) Field of Classification Search
  CPC ......... H01L 21/823431; H01L 21/0217; H01L 21/0228; H01L 21/0332; H01L 21/0337; H01L 21/31111; H01L 21/32139; H01L 21/823437; H01L 29/66545; H01L 21/02359; H01L 21/02318; H01L 21/02334; H01L 21/02343; H01L 21/02164; H01L 21/022; H01L 21/02299; H01L 21/02301; H01L 21/02307
  See application file for complete search history.

(56) References Cited

U.S. PATENT DOCUMENTS

| 6,025,115 | A | * | 2/2000 | Komatsu | C23C 16/047 257/E21.033 |
|---|---|---|---|---|---|
| 6,150,282 | A | | 11/2000 | Rath et al. | |
| 6,372,644 | B1 | * | 4/2002 | Foster | H01L 29/665 257/E21.438 |
| 8,524,606 | B2 | | 9/2013 | Charns et al. | |
| 2003/0064323 | A1 | * | 4/2003 | Sato | G03F 7/0035 430/313 |

(Continued)

FOREIGN PATENT DOCUMENTS

EP  1536291  6/2005

*Primary Examiner* — Scott B Geyer
(74) *Attorney, Agent, or Firm* — Winston Hsu; Scott Margo

(57) ABSTRACT

A method of forming a multilayer hard mask includes the following steps. An unpatterned multilayer hard mask is formed on a semiconductor substrate. The unpatterned multilayer hard mask includes a first hard mask layer formed on the semiconductor substrate and a second hard mask layer directly formed on the first hard mask layer. A treatment is performed on a top surface of the first hard mask layer before the step of forming the second hard mask layer, and the treatment is configured to remove impurities on the first hard mask layer and form dangling bonds on the top surface of the first hard mask layer. Defects related to the first hard mask layer and the second hard mask layer may be reduced, and the manufacturing yield may be enhanced accordingly.

7 Claims, 4 Drawing Sheets

(56) References Cited

U.S. PATENT DOCUMENTS

| | | | |
|---|---|---|---|
| 2005/0067702 A1* | 3/2005 | America | H01L 21/02126 257/753 |
| 2008/0153266 A1* | 6/2008 | Leys | H01L 21/02057 438/479 |
| 2010/0291740 A1* | 11/2010 | Makita | H01L 21/2022 438/151 |

* cited by examiner

METHOD OF FORMING MULTILAYER HARD MASK WITH TREATMENT FOR REMOVING IMPURITIES AND FORMING DANGLING BONDS

BACKGROUND OF THE INVENTION

1. Field of the Invention

The present invention relates to a method of forming a multilayer hard mask, and more particularly, to a method including a treatment performed on a top surface of a first hard mask layer before a step of forming a second hard mask layer on the first hard mask layer and configured to remove impurities and form dangling bonds on the top surface of the first hard mask layer.

2. Description of the Prior Art

Recently, a multilayer hard mask including different material layers is used in the manufacturing process of gates in a semiconductor device for forming the gates with excellent properties such as complete profiles and sufficient height. The material layers of the multilayer hard mask may be formed by atomic layer deposition (ALD) processes for controlling the deposition thickness more precisely and uniformly. However, due to the deposition mechanism of the ALD process, tiny impurities might be formed on the surface of the deposited material layer, and defects might occur in the multilayer hard mask after the step of forming the subsequent material layer of the multilayer hard mask. Accordingly, the profile of the gates formed by using the multilayer hard mask may be influenced, and the electrical performance of the semiconductor device may be affected too.

SUMMARY OF THE INVENTION

According to the claimed invention, a method of forming a multilayer hard mask is provided. The method includes the following steps. First of all, a semiconductor substrate is provided. An unpatterned multilayer hard mask is formed on the semiconductor substrate. The unpatterned multilayer hard mask includes a first hard mask layer formed on the semiconductor substrate and a second hard mask layer directly formed on the first hard mask layer. A treatment is performed on a top surface of the first hard mask layer before the step of forming the second hard mask layer, and the treatment is configured to remove impurities on the first hard mask layer and form dangling bonds on the top surface of the first hard mask layer.

According to the method of forming the multilayer hard mask in the present invention, a treatment is used to remove the impurities on the first hard mask layer and form dangling bonds on the top surface of the first hard mask layer before the step of forming the second hard mask layer directly on the first hard mask layer. Defects in the unpatterned multilayer hard mask may be reduced accordingly, and related manufacturing yield may be enhanced.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-6 are schematic drawings illustrating the method of forming the multilayer hard mask according to the embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

DETAILED DESCRIPTION

Figure 1:
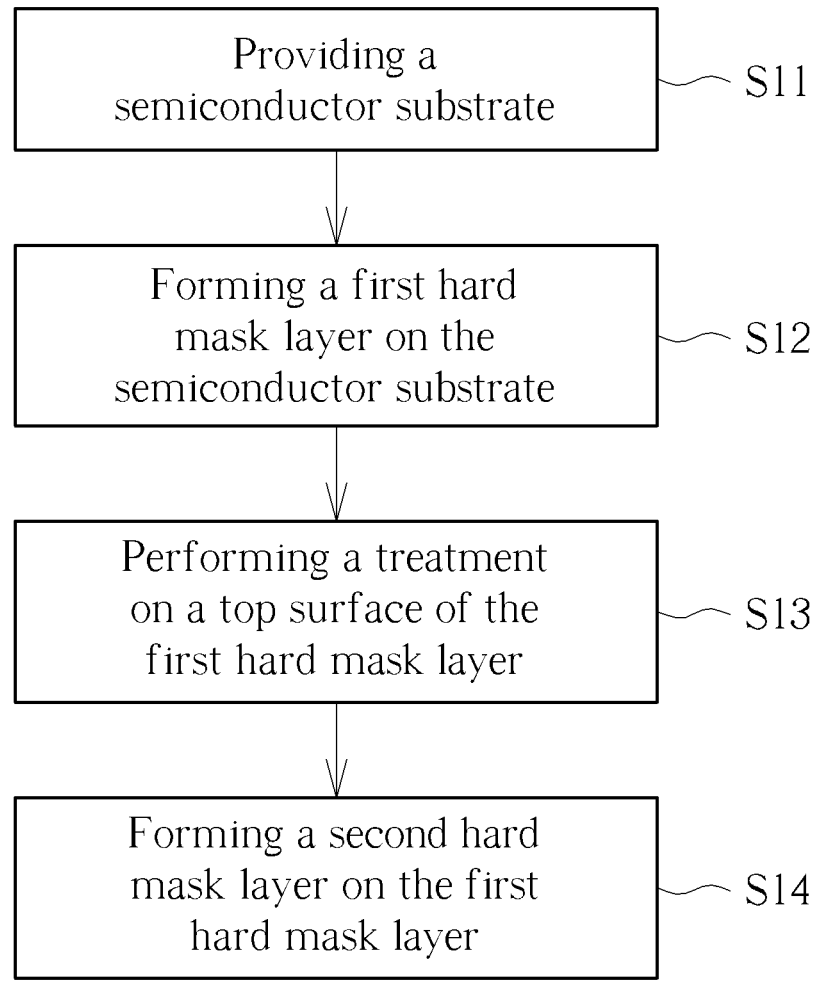
FIG. 1 is a flow chart illustrating a method of forming an unpatterned multilayer hard mask according to an embodiment of the present invention.
Figure 2:
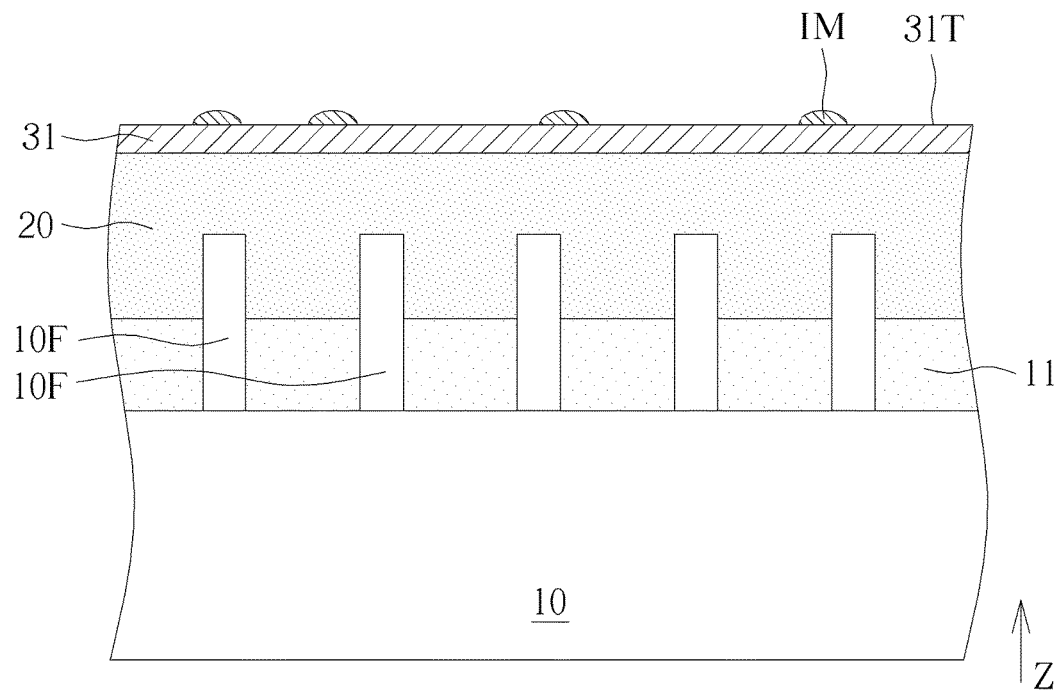

Please refer to FIGS. 1-6. FIG. 1 is a flowchart illustrating a method of forming an unpatterned multilayer hard mask according to an embodiment of the present invention. FIGS. 2-6 are schematic drawings illustrating the method of forming the multilayer hard mask in this embodiment. The method of forming the multilayer hard mask in this embodiment includes the following steps. As shown in FIG. 1 and FIG. 2, in step S11, a semiconductor substrate 10 is provided. The semiconductor substrate 10 may be a semiconductor substrate including silicon substrate, epitaxial substrate, silicon carbide substrate, or silicon-on-insulator (SOI) substrate, but not limited thereto. In step S12, a first hard mask layer 31 is formed on the semiconductor substrate 10. In this embodiment, the semiconductor substrate 10 may include a plurality of fin structures 10F protruding in a vertical direction Z, and a shallow trench isolation (STI) 11 may be formed between the fin structures 10F, but not limited thereto. Additionally, a silicon layer 20 such as an amorphous silicon layer or a polysilicon layer may be formed on the semiconductor substrate 10 before the step of forming the first hard mask layer 31. In other words, a plurality of fin structures 10F may be formed on the semiconductor substrate 10 before the step of forming the silicon layer 20. Additionally, a gate dielectric layer (not shown) may be optionally formed between the silicon layer 20 and the fin structures 10F, but not limited thereto.

In this embodiment, the first hard mask layer 31 may be a silicon nitride layer, and the first hard mask layer 31 may be formed by an atomic layer deposition (ALD) process, but not limited thereto. In other embodiments of the present invention, other suitable materials and/or other appropriate manufacturing processes may also be used to form the first hard mask layer 31. ALD film growth is self-limited and based on surface reactions, which makes achieving atomic scale deposition control possible. In the atomic layer deposition process, a sequential use of a gas phase chemical process is applied. Generally, the atomic layer deposition reactions use two or more chemicals, typically called precursors. These precursors react with the surface of a material one at a time in a sequential and self-limiting manner. The precursor gas is introduced into the process chamber and produces a monolayer of gas on the substrate. A second precursor of gas is then introduced into the chamber reacting with the first precursor to produce a monolayer of film on the substrate. Through the repeated exposure to separate precursors, a thin film may be slowly deposited. When the first hard mask layer 31 is a silicon nitride layer formed by the atomic layer deposition process, silane ($SiH_4$) and ammonia ($NH_3$) are generally used as precursors in the atomic layer deposition process, and silane is introduced first in the process. Impurities IM may be formed on a top surface 31T the first hard mask layer 31, and the impurities IM may include silicon-rich impurities formed in the atomic layer deposition process of forming the first hard mask layer 31 because the barrier for formation of Si—Si bonds is below the barrier for formation of N—N bonds, but not limited thereto.

Figure 3:
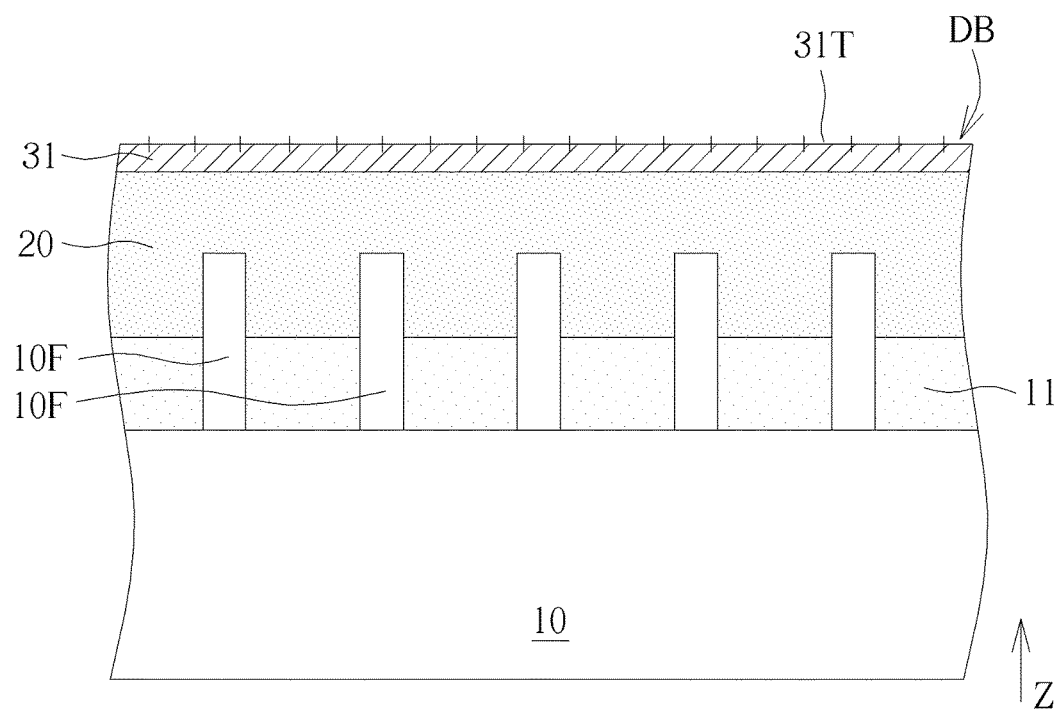

Therefore, as shown in FIGS. 1-3, in step S13, a treatment is performed on the top surface 31T of the first hard mask layer 31, and the treatment is configured to remove the impurities IM on the first hard mask layer 31 and form dangling bonds DB on the top surface 31T of the first hard mask layer 31. The treatment in this embodiment may include a dilute hydrofluoric acid (DHF) treatment, but not limited thereto. For example, the DHF treatment may be performed at room temperature, the treatment time may range between 10 seconds and 20 seconds, and a ratio of HF to water may range between 1:100 and 1:1000. In other embodiments of the present invention, other suitable chemicals and/or process conditions may be used in the treatment for removing the impurities IM and forming the dangling bonds DB on the top surface 31T of the first hard mask layer 31.

Figure 4:
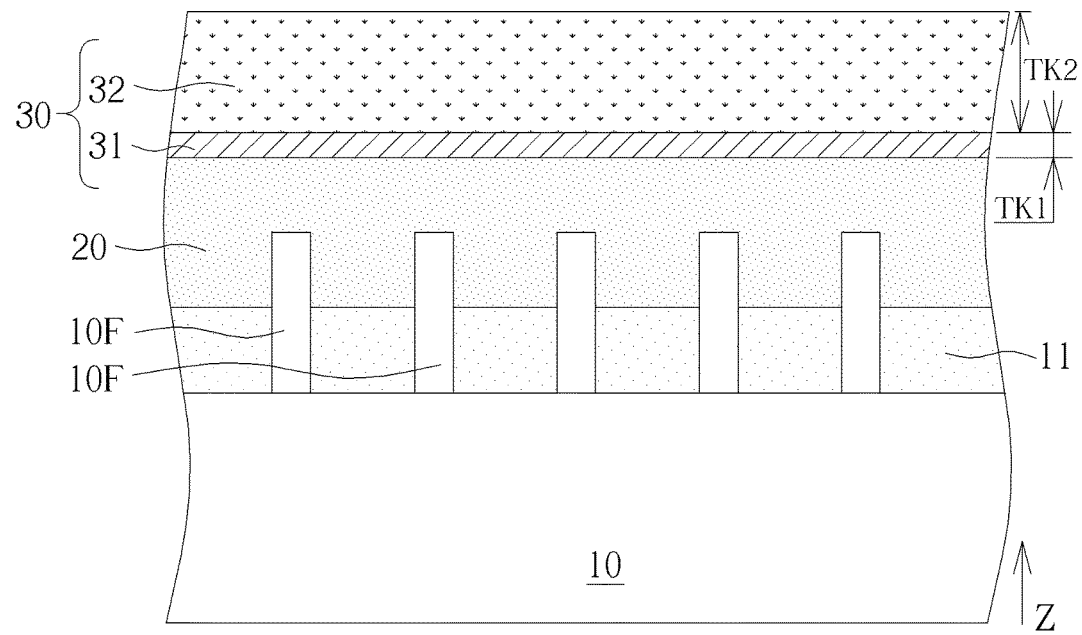

As shown in FIG. 1, FIG. 3, and FIG. 4, in step S14, a second hard mask layer 32 is then directly formed on the first hard mask layer 31. The material of the second hard mask layer 32 is different from the material of the first hard mask layer 31. For example, the first hard mask layer 31 may be a silicon nitride layer, and the second hard mask layer 32 may be an oxide layer, such as a silicon oxide layer, but not limited thereto. The second hard mask layer 32 may be formed by an atomic layer deposition process or other suitable manufacturing processes. Accordingly, an unpatterned multilayer hard mask 30 including the first hard mask layer 31 and the second hard mask layer 32 is formed on the semiconductor substrate 10, and the treatment on the to surface 31T of the first hard mask layer 31 is performed before the step of forming the second hard mask layer 32. The growth condition of the second hard mask layer 32 may be improved because of the improved surface quality of the first hard mask layer 31 and/or the dangling bonds DB formed on the top surface 31T of the first hard mask layer 31 by the treatment mentioned above, and the defects of the unpatterned multilayer hard mask 30 may be reduced because the impurities on the top surface 31T of the first hard mask layer 31 are removed by the treatment mentioned above. It is worth noting that, in this embodiment, a thickness of the first hard mask layer 31 (such as a first thickness TK1 shown in FIG. 4) may be less than a thickness of the second hard mask layer 32 (such as a second thickness TK2 shown in FIG. 4) preferably. For example, a ratio between the first thickness TK1 and the second thickness TK2 (TK1:TK2) may range between 1:7 and 3:7, but not limited thereto. The relatively thicker second hard mask layer 32 may be used to keep a sufficient height of the silicon layer 20 and/or keep the first hard mask layer 31 from being damaged in the subsequent processes. For example, the first thickness TK1 of the first hard mask layer 31 may range between 100 angstroms and 300 angstroms, and the second thickness TK2 of the second hard mask layer 32 may range between 700 angstroms and 1200 angstroms.

Figure 5:
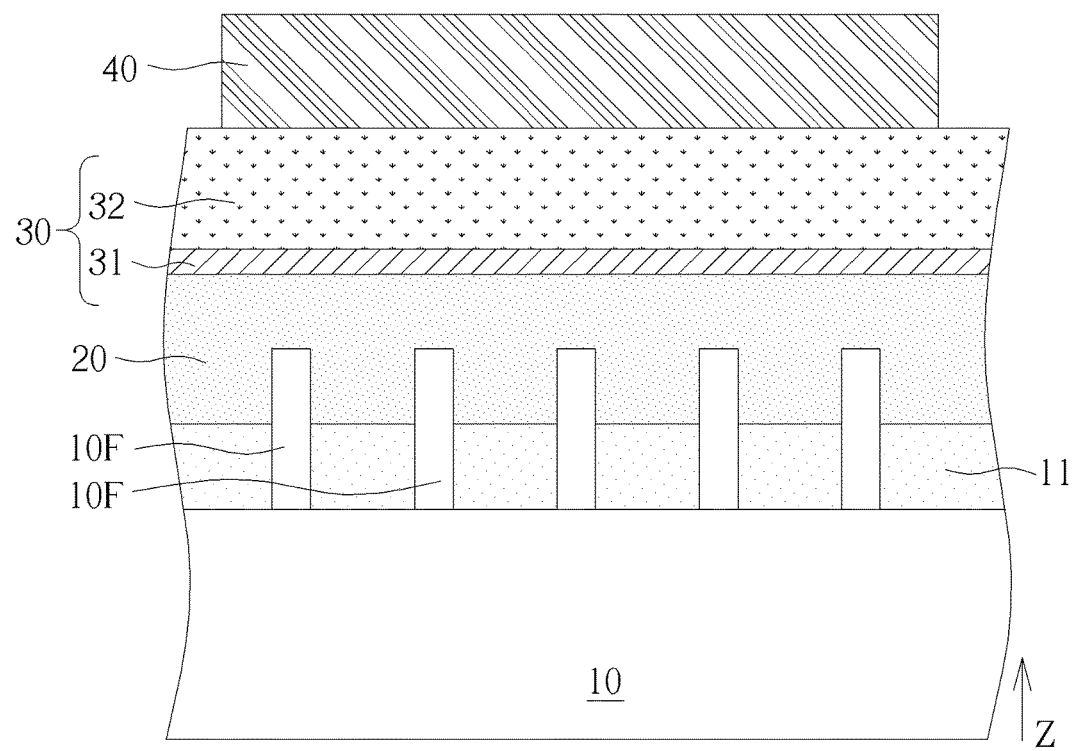
Figure 6:
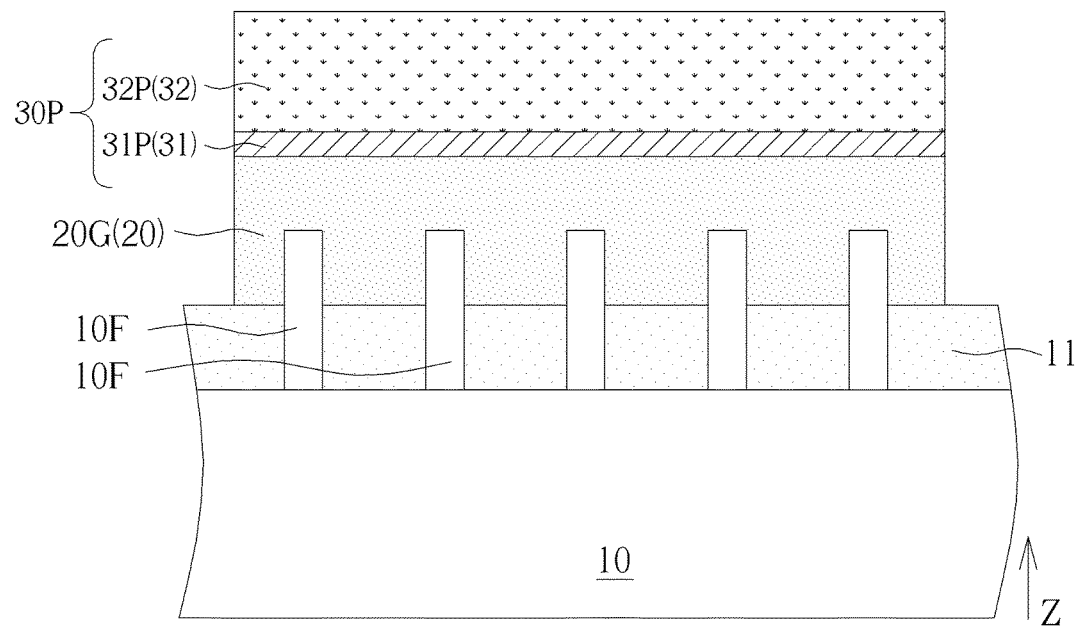

As shown in FIG. 5 and FIG. 6, a patterned resist 40 is then formed on the unpatterned multilayer hard mask 30. An etching process may be performed to pattern the unpatterned multilayer hard mask by 30 using the patterned resist 40 as a mask for forming a multilayer hard mask 30P, and the silicon layer 20 is patterned by using the multilayer hard mask 30P as a mask for forming a dummy gate 20G. Subsequently, a typical transistor fabrication process could be carried out by forming a main spacer on the sidewall of the stack including the dummy gate 20G, a first patterned hard mask 31P, and a second patterned hard mask 32P as shown in FIG. 6, and then forming a source/drain region in the semiconductor substrate 10 adjacent to two sides of the main spacer. Elements including silicides, contact etch stop layer (CESL), and interlayer dielectric (ILD) layer could be formed thereafter, and a replacement metal gate (RMG) process could also be conducted to transform the dummy gate 20G into metal gates. As these processes are well known to those skilled in the art, the details of which are not explained herein for the sake of brevity.

In this embodiment, the treatment on the top surface of the first hard mask layer 31 is performed before the step of patterning the first hard mask layer 31 and before the step of forming the second hard mask layer 32 directly on the first hard mask layer 31. The first hard mask layer 31 and the second hard mask layer 32 may be patterned together for avoiding misalignments between the first patterned hard mask 31P and the second patterned hard mask 32P accordingly.

It is worth noting that the multilayer hard mask 30P in this invention is not limited to be used for forming the gate or the dummy gate of the semiconductor device. In other embodiments of the present invention, multilayer hard mask 30P may also be used in other patterning processes for forming other parts of the semiconductor device, such as the STI or the contact via, but not limited thereto. In other words, the method of the present invention may be applied to various types of semiconductor devices. For example, the applicable semiconductor device may include field-effect transistors, such as n-channel FETs (NFETs) and/or p-channel FETs (PFETs).

To summarize the above descriptions, in the method of forming the multilayer hard mask of the present invention, the treatment configured to remove the impurities on the first hard mask layer and form the dangling bonds on the top surface of the first hard mask layer is performed before the step of forming the second hard mask layer directly on the first hard mask layer. Accordingly, the defects in the unpatterned multilayer hard mask may be reduced, and related manufacturing yield may be enhanced. In addition, the growth condition of the second hard mask layer may also be improved because of the improved surface quality of the first hard mask layer and/or the dangling bonds formed on the top surface of the first hard mask layer by the treatment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a multilayer hard mask, comprising:
   providing a semiconductor substrate;
   forming an unpatterned multilayer hard mask on the semiconductor substrate, wherein the unpatterned multilayer hard mask comprises:
      a first hard mask layer formed on the semiconductor substrate; and
      a second hard mask layer directly formed on the first hard mask layer, wherein the first hard mask layer comprises a silicon nitride layer, and the second hard mask layer comprises an oxide layer; and
   performing a treatment on a top surface of the first hard mask layer before the step of forming the second hard mask layer, wherein the treatment is configured to remove impurities on the first hard mask layer and form dangling bonds on the top surface of the first hard mask layer, wherein the treatment comprises a dilute hydrofluoric acid (DHF) treatment.

2. The method of claim 1, wherein the DHF treatment is performed at room temperature.

3. The method of claim 1, wherein the first hard mask layer is formed by an atomic layer deposition (ALD) process.

4. The method of claim 1, wherein a thickness of the first hard mask layer is less than a thickness of the second hard mask layer.

5. The method of claim 1, further comprising:
forming a silicon layer on the semiconductor substrate before the step of forming the unpatterned multilayer hard mask;
forming a patterned resist on the unpatterned multilayer hard mask; and
patterning the unpatterned multilayer hard mask by using the patterned resist as a mask for forming a multilayer hard mask.

6. The method of claim 5, further comprising:
patterning the silicon layer by using the multilayer hard mask as a mask for forming a dummy gate.

7. The method of claim 5, further comprising:
forming a plurality of fin structures on the semiconductor substrate before the step of forming the silicon layer.

* * * * *